United States Patent [19]
John et al.

[11] Patent Number: 5,905,641
[45] Date of Patent: May 18, 1999

[54] ELECTRICAL CONNECTION WITH ELECTROMAGNETIC COMPATIBILITY

[75] Inventors: Hans-Jörg John, Paderborn; Rolf Paland, Grebenstein, both of Germany

[73] Assignee: Siemens Nixdorf Informationssysteme Aktiengesellschaft, Paderborn, Germany

[21] Appl. No.: 08/894,760
[22] PCT Filed: Feb. 6, 1996
[86] PCT No.: PCT/DE96/00181
  § 371 Date: Aug. 27, 1997
  § 102(e) Date: Aug. 27, 1997
[87] PCT Pub. No.: WO96/27281
  PCT Pub. Date: Sep. 6, 1996

[30] Foreign Application Priority Data

Feb. 27, 1995 [DE] Germany .......................... 195 06 801

[51] Int. Cl.⁶ .................................................. H05K 9/00
[52] U.S. Cl. ......................... 361/818; 361/753; 361/800; 174/35 R
[58] Field of Search ..................................... 361/748, 752, 361/753, 759, 796, 800, 816, 818, 784, 788; 174/35 R

[56] References Cited

FOREIGN PATENT DOCUMENTS

| 0 383 357 | 8/1990 | European Pat. Off. . |
| 0 534 372 | 3/1993 | European Pat. Off. . |
| 39 34 845 | 5/1990 | Germany . |
| 41 22 245 | 2/1992 | Germany . |
| 91 13 659 U | 3/1992 | Germany . |
| 93 13 327 U | 1/1994 | Germany . |

Primary Examiner—Leo P. Picard
Assistant Examiner—Jayprakash N. Gandhi
Attorney, Agent, or Firm—Hill & Simpson

[57] ABSTRACT

Leading an electrical connection (40), arranged on a printed circuit board (32), in a fashion exhibiting EMC out of a screening housing (12), one wall (16) of which is provided with a slit (18) through which a part (36), bearing an electrical connection (40), of the printed circuit board (32) can project. The edges (20) of the slit (18) are provided with a contact strip (24) which makes contact with an electrically conducting coating (38) of the printed circuit board (32).

8 Claims, 1 Drawing Sheet

ELECTRICAL CONNECTION WITH ELECTROMAGNETIC COMPATIBILITY

BACKGROUND OF THE INVENTION

1. Field of the Invention

The present invention relates to a subrack for pluggable printed circuit boards, with a screening or shielding housing in which a connecting backplane with backplane connectors for electrically connecting the printed circuit boards to one another and/or to other modules is arranged, and a printed circuit board from which an electric line is led out of the housing to an electrical connection in a fashion exhibiting EMC (electromagnetic compatibility).

2. Description of the Related Art

The German Patent Document DE-A-39 07 278 discloses a transfer system for electric signals in which printed circuit boards having electronic circuits arranged in on them are arranged parallel to one another in a screening housing. The cuboid housing is sealed by metal walls on five sides in a fashion exhibiting EMC (electromagnetic compatibility). Fitted on the end face of each printed circuit board is a metal front plate which directly adjoins a neighboring front plate or a side wall of the housing and is in metallic contact therewith. The juxtaposition of the front plates forms the sixth housing wall. An electrical connection, led out of the housing, of a printed circuit board is designed as a plug which penetrates the front plate.

The known arrangement ensures a sealing of the housing which exhibits EMC only if the sixth housing side is sealed without a gap by front plates or dummy elements. Leading the electrical connections out of the screening housing in a fashion exhibiting EMC is therefore already technically complicated and thus expensive because a special plate must be held in reserve for each type of plug used. Moreover, each printed circuit board must be provided with a front plate even if it has no electrical connection to the outside. Unassigned board slots for printed circuit boards must be sealed by a dummy element in the form of a front plate. Added to this are the contact strips on the longitudinal sides of the front plates and dummy elements which make the galvanic contact with the neighbor.

In the known transfer system for electric signals, connections are initially led from the data processing unit located in the screening housing to a backplane which separates the screening housing from the actual transfer space. However, depending on the type and number of the printed circuit boards used in a data processing unit and on the peripherals to be connected to the latter, the mounting of components therein can vary greatly. Thus, either it is necessary to provide the backplane with a number of plugs which are required for the maximum mounting of components in the data processing unit, which plugs must in addition have the maximum number of poles to be expected, or it is necessary to hold various backplanes in reserve for the different component mounting variants. Both solutions are impracticable because of the high costs alone.

SUMMARY OF THE INVENTION

It is an object of the present invention to provide a subrack for holding variously mounted pluggable printed circuit boards in any combination and with any degree of assignment of the available board slots in a fashion exhibiting EMC (electromagnetic compatibility), and to provide a printed circuit board from which an electric line is led to an electrical connection for connection outside of the housing in a fashion exhibiting EMC. The housing being shielded against electromagnetic leakage without additional mechanical structural elements on the printed circuit board.

This and other objects and advantages of the invention are provided by a subrack for pluggable printed circuit boards, with, in combination, a screening housing in which a connecting backplane with backplane connectors for electrically connecting the printed circuit boards to one another and/or to other modules is arranged, and a printed circuit board from which an electric line is led out of the housing to an electrical connection in a fashion exhibiting EMC (electromagnetic compatibility), having the following features: a wall of the screening housing is provided with slits through each of which a printed circuit board can project so that a subarea of the printed circuit board is in the housing and a subarea is outside of the housing, at least one electric line is led out in a fashion exhibiting EMC from a subarea located in the housing to an electrical connection on the subarea projecting from the housing, of the printed circuit board, at least on the subarea projecting from the housing, the printed circuit board carries a signal-free electrically conducting coating, at least on one side, and at least the longitudinal edges of the slits are provided with elastically deformable, electrically conductive contact strips which are electrically connected to the wall and bear against one another or, given the presence of a printed circuit board penetrating a slit, against the coating of the printed circuit board while making contact.

The present invention proceeds from the finding that a large-area electrically conducting coating on a printed circuit board has a good screening effect for high-frequency electrical interference. If electrical connecting lines— these are generally conductor tracks in the case of printed circuit boards—are enclosed between such coatings, the conductor tracts are unable to emit electromagnetic interference signals into the environment. In the case of multilayer printed circuit boards, conductor tracks conducting high-frequency signals can be led with particular advantage on an inner layer, and the outer layers can be coated in an electrically conducting fashion. In this way, signal and voltage supply lines can be led up to electrical connecting elements, for example plugs, terminal strips or solder tag strips, in a fashion exhibiting EMC.

The present invention also includes in the screening of the housing the coated areas of a printed circuit board arranged in the housing, by virtue of the fact that the printed circuit board projects from the housing through a slit in a wall of the housing. Connecting elements for electrical connections leading out of the housing are arranged on the part of the printed circuit board projecting from the housing.

In order to produce an electrical connection between the wall and the coated areas of the printed circuit board, at least the longitudinal edges of the slit are provided with elastically deformable, electrically conducting contact strips which bear against the printed circuit board and make contact with the coated areas thereof. If no printed circuit board projects through the slit, the contact strips bear against one another and seal the slit. This has the advantage that the housing is always sealed in a fashion exhibiting EMC even in the case of fewer circuit boards are mounted than slots available for mounting. It is also possible to use printed circuit boards of different lengths, in particular shorter printed circuit boards which do not project from the screening housing, without impairing the screening effect of the housing.

BRIEF DESCRIPTION OF THE DRAWINGS

Further features and advantageous developments of the invention are to be gathered from the following description and the drawing of exemplary embodiments, in which drawing.

DETAILED DESCRIPTION OF THE PREFERRED EMBODIMENTS

Figure 1:
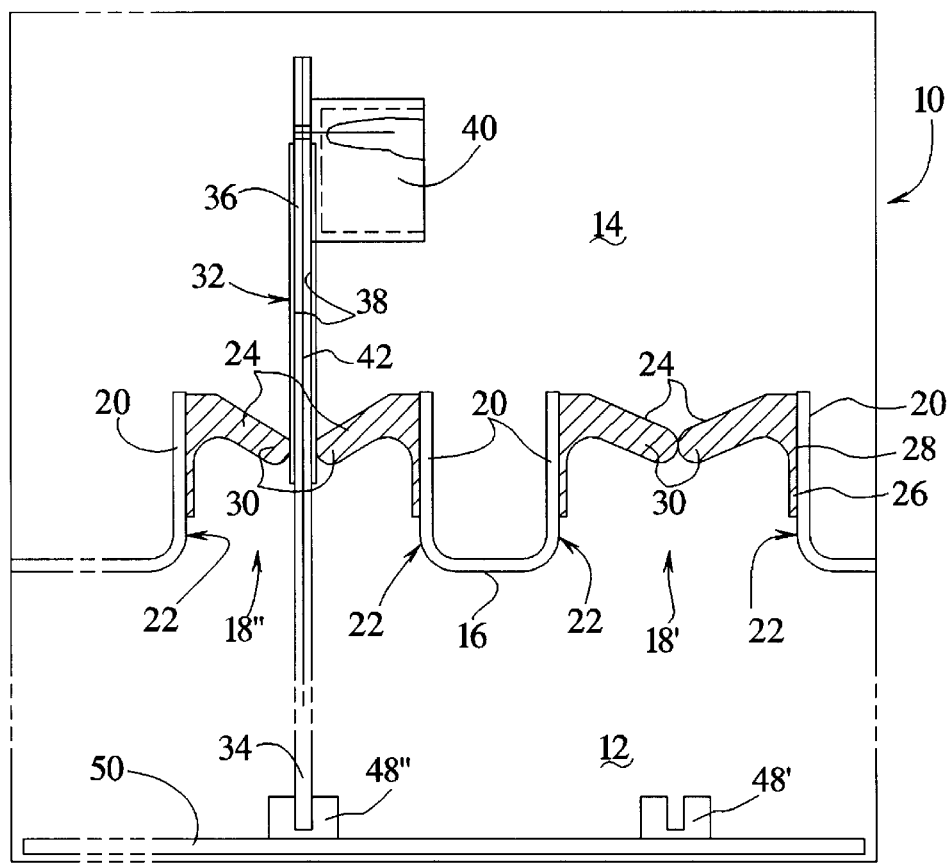
FIG. 1 shows a diagrammatic plan view of a cut-away computer housing having a printed circuit board, in accordance with the first exemplary embodiment.

FIG. 1 shows a computer housing 10 in plan view diagrammatically. It comprises two parts: a screening housing 12 and a cable terminal compartment 14. A wall 16 of the housing 12 adjoining the cable terminal compartment 14 is provided with slits 18 whose longitudinal edges 20 are bent away at right angles in the direction of the cable terminal compartment 14. Each slit 18 is spatially assigned a backplane plug 48. The plugs 48 are arranged on a connecting backplane 50 opposite the slitted wall 16 in the housing 12.

Electrically conducting contact strips 24 are applied to the mutually facing areas 22 of the bent-away edge regions. The contact strips 24 are of sponge rubber which is coated with an electrically conducting wire mesh or with a metal-coated plastic gauze and/or is itself conductive. The contact strip 24 has a V-shaped profile. One V-limb 26 is bonded onto the area 22 with the aid of an adhesive tape 28 which adheres on both sides and covers only a part of the surface with which the V-limb 26 bears against the area. An electrically conducting connection between the contact strip 24 and the wall 16 is produced via the subareas that are not covered by the adhesive tape 28. It is also possible to use an adhesive, preferably an electrically conducting adhesive, instead of an adhesive tape.

The free V-limbs 30 of mutually opposite contact strips 24 touch one another, as is shown in the case of a first slit 18'. This slit is thus sealed in a fashion exhibiting EMC. A printed circuit board 32 is plugged into a second slit 18". Said printed circuit board projects with a first subarea 34 into the screening housing 12, where it is plugged into the backplane connector 48" opposite the slit 18". The printed circuit board 32 projects into the cable terminal compartment 14 with a second subarea 36. Electric circuits can be arranged on the first subarea 34. Furthermore, inside the screening housing 12 a printed circuit board 32 can be connected via the connecting backplane 50, which carries electrical wiring which is not represented in the drawing for the sake of simplicity, to further printed circuit boards 32 plugged into other backplane connectors 48 and/or to modules which are (likewise not represented) for example a power supply or a bulk storage device, arranged on the connecting backplane 50 or separately therefrom.

The second subarea 36, projecting into the cable terminal compartment 14, of the printed circuit board 32 is provided on both sides with an electrically conductive coating 38. The coating 38 is expediently represented by the copper cladding from which the conductor tracks located in any case on the printed circuit boards are formed. These electrically conducting coatings 38 are connected in the cable terminal compartment in a fashion running around the edge of the printed circuit board with plated-through holes that are not shown here. The spacing of the plated-through holes from the connection of the conducting coating 38 on the outer sides is determined by the smallest wavelength to be screened. The conducting coating 38 can also be led around the edges of the printed circuit board 32 as an alternative to this measure or in addition to it. The coating 38 extends so far into the second slit 18" that the free limb 30 of the contact strips 24 can come into contact with it. Consequently, the coating 38 is at the same potential—in general this is a frame potential—as the screening housing 12. Fitted on the second subarea 36, projecting into the cable terminal compartment 14, of the printed circuit board 32 is a plug 40 to whose contact pins electrical signals and/or supply voltages can be led via conductor tracks 42 on an inner layer of the printed circuit board 32. The electrical connections led out of the screening housing 12 are thereby led in a fashion completely exhibiting EMC.

Figure 2:
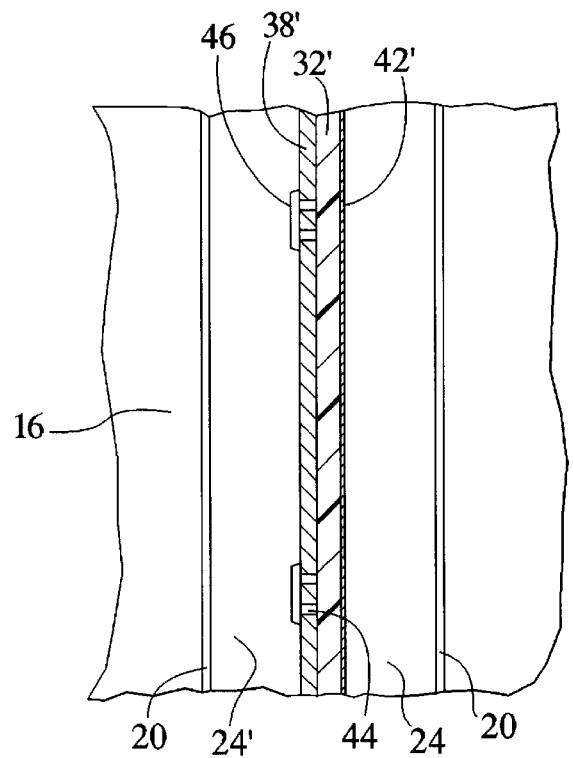
FIG. 2 shows a detail of a wall provided with a slit, in a front view with a printed circuit board, in accordance with a second exemplary embodiment.

FIG. 2 shows a detail of a wall 16 provided with a slit 18 in a front view, with a printed circuit board 32' in accordance with the second exemplary embodiment of the invention. The printed circuit board 32' is coated on one side with an electrically conducting coating 38' with recesses 44 into which conductor tracks 42' are embedded. The conductor tracks 42' are covered in the region of the contact strip 24' with an insulating layer 46.

The second exemplary embodiment of electrical connections being led out of a screening housing 12 is also suitable for single-layer and/or one-sidedly coated printed circuit boards 32'. Although the recesses 44 and the material thickness of the printed circuit board 32' form interruptions in the screening of interfering radiation provided by the screening housing 12, the screening effect of the housing 12 suffices to screen electromagnetic interference, in particular when the wavelength thereof is large by comparison with the dimensions of these interruptions.

The invention covers various possible modifications in the form of the wall 16 and of the contact strips 24:

The longitudinal edges 20 of the slits 18 need not be bent away relative to the wall 16, but can rather also be straight.

Instead of V-shaped contact strips, it is also possible to use strips having a round or oval, solid or hollow cross section.

The contact strips can be provided with a longitudinal slit having the width of the material thickness of the slit edges, which permit the contact strips to be plugged onto the longitudinal edges 20 of the slits 18.

It is also possible to use contact strips made from metal, in particular from spring sheet metal which in the region of contact with the electrically conducting coating 38 of the printed circuit board 32 are slit or feathered or provided with brushes made from an electrically conducting material.

The arrangement, represented in FIG. 1, of the connecting backplane 50 on the wall of the housing 12 opposite the slitted wall 16 is particularly suitable for printed circuit boards whose link connectors to the connecting backplane 50 and whose plug 40 to the outside are arranged on mutually opposite sides of the printed circuit board 32. It is likewise possible to arrange the connecting backplane perpendicular to the slitted wall 16 in the housing 12. Such an arrangement is particularly suitable for printed circuit boards having a design such as is disclosed, for example, in ISA bus add-on cards for PC (IEEE Proposal P996). Although other modifications and changes may be suggested by those skilled in the art, it is the intention of the inventors to embody within the patent warranted hereon all changes and modifications as reasonably and properly come within the scope of their contribution to the art.

We claim:

1. A subrack with pluggable printed circuit boards, comprising:

a screening housing in which a connecting backplane with backplane connectors for electrically connecting the printed circuit boards to one another and/or to other modules is arranged, a printed circuit board having a first portion connected to one of said backplane connectors in said screening housing and having a second portion with an electrical connection, a wall of said screening housing provided with means defining a slit through which said printed circuit board projects with said first portion within said screening housing and said second portion outside said screening housing, at least one electric line on said printed circuit board led out in a fashion exhibiting electromagnetic compatability from said first portion located in said screening housing to said electrical connection on said second portion projecting from said screening housing, a signal-free electrically conducting coating on at least on one side of said second portion of said printed circuit board extending from said screening housing, and elastically deformable, electrically conductive contact strips on at least longitudinal edges of the slits, said elastically deformable, electrically conductive contact strips being electrically connected to the wall and bearing against one another in an absence of said printed circuit board extending through the slit and in the presence of said printed circuit board penetrating the slit, bearing against said signal-free electrically conducting coating on said printed circuit board to make electrical contact.

2. A subrack as claimed in claim 1, wherein said signal-free electrically conducting coating is on both outer surfaces of the printed circuit board, and said printed circuit board has conductive tracks on an inner layer for feeding electric signals and/or of supply voltages to the electrical connection.

3. A subrack as claimed in claim 2, wherein said signal-free electrically conducting coatings are connected to one another on the two outer surfaces at edges of the printed circuit board.

4. A subrack as claimed in claim 1, wherein said printed circuit board includes conductor tracks on an outer layer of the printed circuit board, said conductor tracks being embedded in recesses of the electrically conducting coating, and a contact strip with an insulating layer over at least a contact region of said conductor tracks.

5. A subrack as claimed in claim 4, wherein said contact strip includes a sponge rubber coated with a wire mesh.

6. A subrack as claimed in claim 1, further comprising:

a cable terminal compartment adjoining the wall, provided with slits of the screening housing which surrounds said second portion projecting from said screening housing.

7. A subrack as claimed in claim 4, wherein said contact strip includes a metal-coated plastic gauze.

8. A subrack as claimed in claim 4, wherein said contact strip includes an electrically conducting sponge rubber.

* * * * *